(12) United States Patent
Hidaka et al.

(10) Patent No.: US 11,107,719 B2
(45) Date of Patent: Aug. 31, 2021

(54) ELECTROSTATIC CHUCK DEVICE AND METHOD FOR MANUFACTURING ELECTROSTATIC CHUCK DEVICE

(71) Applicant: SUMITOMO OSAKA CEMENT CO., LTD., Tokyo (JP)

(72) Inventors: Nobuhiro Hidaka, Tokyo (JP); Hironori Kugimoto, Tokyo (JP); Mamoru Kosakai, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 467 days.

(21) Appl. No.: 16/069,141

(22) PCT Filed: Jan. 12, 2017

(86) PCT No.: PCT/JP2017/000776
§ 371 (c)(1),
(2) Date: Jul. 10, 2018

(87) PCT Pub. No.: WO2017/122716
PCT Pub. Date: Jul. 20, 2017

(65) Prior Publication Data
US 2019/0019713 A1   Jan. 17, 2019

(30) Foreign Application Priority Data

Jan. 12, 2016 (JP) .............................. JP2016-003618
Mar. 30, 2016 (JP) .................................. 2016-067657

(51) Int. Cl.
*H01L 21/683* (2006.01)
*C04B 35/103* (2006.01)
(Continued)

(52) U.S. Cl.
CPC ........ *H01L 21/6833* (2013.01); *C04B 35/103* (2013.01); *C04B 35/111* (2013.01);
(Continued)

(58) Field of Classification Search
CPC ....... H01L 21/00; H01L 21/67; H01L 21/683; H01L 21/6831; H01L 21/68714;
(Continued)

(56) References Cited

U.S. PATENT DOCUMENTS

2003/0123213 A1* 7/2003 Kosakai ................. H02N 13/00
361/234
2017/0057875 A1   3/2017 Ishizuka et al.

FOREIGN PATENT DOCUMENTS

JP   01-179754 A   7/1989
JP   07-235563 A   9/1995
(Continued)

OTHER PUBLICATIONS

English translation of JP 09-283606. (Year: 1997).*
(Continued)

*Primary Examiner* — Thienvu V Tran
*Assistant Examiner* — Carlos O Rivera-Perez
(74) *Attorney, Agent, or Firm* — Merchant & Gould P.C.

(57) ABSTRACT

An electrostatic chuck device includes: a base having one principal surface which is a placing surface on which a plate-shaped sample is placed, wherein the base is made from a sintered compact of ceramic particles, which include silicon carbide particles and aluminum oxide particles, as a forming material; and an electrostatic attraction electrode which is provided on a surface of the base on the side opposite to the placing surface of the base, or in the interior of the base, in which the volume resistivity value of the sintered compact is $0.5\times10^{15}$ Ωcm or more in the entire range from 24° C. to 300° C., a graph which shows the relationship of the volume resistivity value of the sintered compact to a temperature at which the volume resistivity value of the sintered compact is measured has a maximum value in the range from 24° C. to 300° C., and the amount (Continued)

of metal impurities in the sintered compact other than aluminum and silicon in the sintered compact is 100 ppm or less.

15 Claims, 8 Drawing Sheets

(51) Int. Cl.
*C04B 35/111* (2006.01)
*C04B 35/626* (2006.01)
*H01L 21/687* (2006.01)
*C04B 35/117* (2006.01)
*C04B 35/645* (2006.01)

(52) U.S. Cl.
CPC ........ *C04B 35/117* (2013.01); *C04B 35/6261* (2013.01); *C04B 35/62635* (2013.01); *C04B 35/62645* (2013.01); *C04B 35/62655* (2013.01); *C04B 35/62695* (2013.01); *C04B 35/645* (2013.01); *H01L 21/68757* (2013.01); *C04B 2235/3217* (2013.01); *C04B 2235/3826* (2013.01); *C04B 2235/3834* (2013.01); *C04B 2235/40* (2013.01); *C04B 2235/5445* (2013.01); *C04B 2235/5454* (2013.01); *C04B 2235/604* (2013.01); *C04B 2235/656* (2013.01); *C04B 2235/658* (2013.01); *C04B 2235/6583* (2013.01); *C04B 2235/725* (2013.01); *C04B 2235/9669* (2013.01)

(58) Field of Classification Search
CPC ........... H01L 21/68757; H01L 21/6875; H01L 21/6833; C04B 35/00; C04B 35/01; C04B 35/10; C04B 35/101; C04B 35/103; C04B 35/111; C04B 35/1115; C04B 35/113; C04B 35/117; C04B 35/622; C04B 35/626; C04B 35/62605; C04B 35/6261; C04B 35/62635; C04B 35/62625; C04B 35/62645; C04B 35/6265; C04B 35/62655; C04B 35/62695; C04B 35/64; C04B 35/645; C04B 2235/00; C04B 2235/02; C04B 2235/30; C04B 2235/32; C04B 2235/3217; C04B 2235/38; C04B 2235/3817; C04B 2235/3826; C04B 2235/383; C04B 2235/3834; C04B 2235/40; C04B 2235/5445; C04B 2235/5454; C04B 2235/60; C04B 2235/604; C04B 2235/65; C04B 2235/656; C04B 2235/658; C04B 2235/6583; C04B 2235/70; C04B 2235/72; C04B 2235/725; C04B 2235/96; C04B 2235/9669; H02N 13/00
USPC ................ 361/143–145, 229, 230, 233, 234; 501/87–89
See application file for complete search history.

(56) References Cited

FOREIGN PATENT DOCUMENTS

| | | |
|---|---|---|
| JP | 08-002961 A | 1/1996 |
| JP | 09-283606 A | 10/1997 |
| JP | 11-171652 A | 6/1999 |
| JP | 2007-207840 A | 8/2007 |
| JP | 4744855 B | 8/2011 |
| WO | 2015/137270 A1 | 9/2015 |

OTHER PUBLICATIONS

English translation of WO 2015/137270. (Year: 2015).*
Office Action for Japanese Patent Application No. 2017-513831 (dated Jul. 17, 2018).
Office Action for Japanese Patent Application No. 2018-168756, dated Aug. 11, 2020.
International Search Report for PCT/JP2017/000776 (dated Apr. 18, 2017).

* cited by examiner

ELECTROSTATIC CHUCK DEVICE AND METHOD FOR MANUFACTURING ELECTROSTATIC CHUCK DEVICE

TECHNICAL FIELD

The present invention relates to an electrostatic chuck device and a method for manufacturing an electrostatic chuck device.

This application is a U.S. National Stage Application under 35 U.S.C. § 371 of International Patent Application No. PCT/JP2017/000776 filed on Jan. 12, 2017, which claims the benefit of priority to Japanese Patent Application No. 2016-003618 filed on Jan. 12, 2016 and Japanese Patent Application No. 2016-067657 filed on Mar. 30, 2016, the disclosures of all of which are hereby incorporated by reference in their entireties. The International Application was published in Japanese on Jul. 20, 2017 as WO 2017/122716.

BACKGROUND

In recent years, in a semiconductor manufacturing apparatus which performs a plasma process, an electrostatic chuck device capable of easily mounting and fixing a plate-shaped sample (a wafer) to a sample stage and capable of maintaining a temperature of the wafer at a desired temperature has been used. The electrostatic chuck device is provided with an electrostatic attraction electrode that generates an electrostatic force (Coulomb's force) between a base having one principal surface which is a pacing surface on which a wafer is placed, and the wafer placed on the placing surface (for example, Patent Literature No. 1).

In a case where the electrostatic chuck device as described above is used in the plasma process, the base on which the wafer is placed is heated to a high temperature by plasma. For this reason, the base is formed using a ceramic material having heat resistance and insulating properties.

In the electrostatic chuck device as described above, the wafer is fixed by using the electrostatic force generated between the wafer and the electrostatic attraction electrode. That is, in the electrostatic chuck device, when fixing the wafer, voltage is applied to the electrostatic attraction electrode to generate an electrostatic force between the wafer and the electrostatic attraction electrode. On the other hand, when removing the wafer fixed to the placing surface in the electrostatic chuck device, the application of the voltage to the electrostatic attraction electrode is stopped to make the electrostatic force between the wafer and the electrostatic attraction electrode disappear.

However, in an electrostatic chuck device of the related art, for example, when an attempt to remove the wafer is made after the plasma process is carried out, an attraction force remains between the heated placing surface and the wafer, and thus there is a case where it becomes difficult to remove the wafer. If such a situation occurs, work efficiency decreases, and therefore, further improvement is demanded.

Further, in recent years, miniaturization or three-dimensional formation of a semiconductor technique has progressed and use conditions of a semiconductor manufacturing apparatus and an electrostatic chuck device which is used in the semiconductor manufacturing apparatus have become more severe. Therefore, an electrostatic chuck device in which it is possible to treat a wafer with better yield has been demanded.

CITATION LIST

Patent Literature

[Patent Literature No. 1] Japanese Patent No. 4744855

SUMMARY OF INVENTION

Technical Problem

A first aspect of the present invention has been made in view of the above circumstances and has an object to provide an electrostatic chuck device in which removal of a wafer is easy even at the time of high-temperature heating.

A second aspect of the present invention has been made in view of the above circumstances and has an object to provide an electrostatic chuck device in which it is possible to improve the yield of plasma treatment and to treat a wafer with high yield.

Further, a third aspect of the present invention has an object to provide a method for manufacturing an electrostatic chuck device in which it is possible to easily manufacture an electrostatic chuck device in which removal of a wafer is easy even at the time of high-temperature heating.

The inventors of the present invention have studied the difficulty of removal of the wafer. As a result, it has been found that the fact that when an electrostatic chuck device is heated by plasma or a built-in heater to reach a high temperature, an electric resistance value (a volume resistivity value) of a base that is a placing surface on which the wafer is placed decreases, and thus energization becomes easier, is one of the factors of the difficulty of the removal. That is, if the volume resistivity value decreases when the base has reached a high temperature, depolarization becomes difficult even after voltage application to the electrostatic attraction electrode is stopped. Therefore, it is thought that the fact that it is easy for a Coulomb's force to remain is one of the factors.

The inventors have performed various studies in order to obtain an electrostatic chuck device capable of treating the wafer with high yield. A ceramic material that is a material for forming a base becomes easy to electrically conduct if it is heated, and thus a voltage (withstand voltage) at which dielectric breakdown occurs decreases. As described above, the electrostatic chuck device is heated to a high temperature in a plasma process. For this reason, in the electrostatic chuck device using a ceramic material as the material for forming the base, depending on the use condition, the base with the lowered withstand voltage is subjected to dielectric breakdown, and thus a semiconductor element, a wiring pattern, or the like to be treated in the plasma process is damaged, so that there is a concern that a yield may be lowered.

The inventors have focused on the above characteristic of the ceramic material. That is, if the withstand voltage of the ceramic material which is used as the material for forming the base is not easily lowered even under a high-temperature condition, it has been thought that dielectric breakdown of the base is prevented, so that the yield can be improved. The inventors have performed intensive studies on the basis of this thought, and as a result, the second aspect of the present invention has been completed.

Solution to Problem

According to a first aspect of the present invention, there is provided an electrostatic chuck device including: a base having one principal surface which is a placing surface on which a plate-shaped sample is placed, wherein the base is made from a sintered compact of ceramic particles, which include silicon carbide particles and aluminum oxide particles, as a forming material; and an electrostatic attraction electrode which is provided on a surface of the base on the side opposite to the placing surface of the base or in an interior of the base, in which a volume resistivity value of the sintered compact is $0.5 \times 10^{15}$ Ωcm or more in an entire range from 24° C. to 300° C., a graph which shows a relationship of the volume resistivity value of the sintered compact to a temperature at which the volume resistivity value of the sintered compact is measured has a maximum value in the range from 24° C. to 300° C., and the amount of metal impurities in the sintered compact other than aluminum and silicon is 100 ppm or less.

According to a second aspect of the present invention, there is provided an electrostatic chuck device including: a base having one principal surface which is a placing surface on which a plate-shaped sample is placed, wherein the base is made from a sintered compact of ceramic particles, which include silicon carbide particles and aluminum oxide particles, as a forming material; and an electrostatic attraction electrode which is provided on a surface of the base on the side opposite to the placing surface of the base or in an interior of the base, in which dielectric breakdown strength of the sintered compact at 180° C. is at least 0.85 times dielectric breakdown strength of the sintered compact at 24° C., and the amount of metal impurities in the sintered compact other than aluminum and silicon is 100 ppm or less.

Here, in this specification, the term "dielectric breakdown strength" refers to, when a test piece of a sintered compact is clamped by electrodes each having a diameter of 25 mm and measured at a voltage increase rate of 2000 V/second in a short time test prescribed in JIS C2110-2, a value obtained by dividing a voltage value when a current value (leakage current value) flowing through the test piece is 5 mA by the thickness of the test piece.

Further, according to a third aspect of the present invention, there is provided a method of manufacturing an electrostatic chuck device equipped with a base having one principal surface which is a placing surface on which a plate-shaped sample is placed, the method including: a step of preparing a slurry wherein aluminum oxide particles and silicon carbide particles are injected respectively at high speed to mix the aluminum oxide particles and the silicon carbide particles while the aluminum oxide particles and the silicon carbide particles are collided with each other; a step of removing a dispersion medium from the slurry obtained in the aforementioned step wherein mixing is performed, and subsequently forming a formed body from the slurry; a step of pressure-sintering the obtained formed body by heating the formed body to a temperature of 1600° C. or higher while compacting the formed body with a pressure of 25 MPa or more under a non-oxidative atmosphere; and a step of grinding an obtained ceramic sintered compact to form the base, in which the electrostatic chuck device includes a base having one principal surface which is a placing surface on which a plate-shaped sample is placed, wherein the base is made from a sintered compact of ceramic particles, which include silicon carbide particles and aluminum oxide particles, as a forming material, and an electrostatic attraction electrode, which is provided on a surface of the base on the side opposite to the placing surface of the base or in an interior of the base.

According to this method, it is possible to preferably manufacture the devices according to the first and second aspects.

In the method of manufacturing an electrostatic chuck device according to the third aspect of the present invention, the aluminum oxide particles may have an aluminum oxide content of 99.99% or more.

In the method of manufacturing an electrostatic chuck device according to the third aspect of the present invention, the non-oxidative atmosphere may be at least one of a vacuum atmosphere and an argon atmosphere.

In the method of manufacturing an electrostatic chuck device according to the third aspect of the present invention, the non-oxidative atmosphere may include a vacuum atmosphere that is a first non-oxidative atmosphere, and an argon atmosphere that is a second non-oxidative atmosphere, and wherein, in the pressure-sintering step, the formed body may be preliminarily heated at a temperature lower than 1600° C. and normal pressure in the first non-oxidative atmosphere, and then the formed body is pressure-sintered in the second non-oxidative atmosphere.

In the method of manufacturing an electrostatic chuck device according to the third aspect of the present invention, the method may further include an oxidation step wherein oxidation treatment is performed on silicon carbide particles which are included in the formed body, before the preliminary heating is performed.

Advantageous Effects of Invention

According to the first and third aspects of the present invention, it is possible to provide an electrostatic chuck device in which removal of a wafer is easy even at the time of high-temperature heating. Further, a manufacturing method in which it is possible to easily manufacture an electrostatic chuck device in which removal of a wafer is easy even at the time of high-temperature heating can be provided.

According to the second and third aspects of the present invention, it is possible to provide an electrostatic chuck device in which it is possible to improve the yield of plasma treatment with high yield.

DESCRIPTION OF EMBODIMENTS

Hereinafter, an electrostatic chuck device according to an embodiment, which is a preferred example of the present invention, will be described with reference to FIG. 1. In all of the following drawings, dimensions, a ratio, or the like of each constitute element is appropriately changed in order to make the drawings easy to see. Further, the following examples are those that are specifically described for better understanding of the gist of the invention, and do not limit the present invention unless otherwise specified. Changes, omissions, or additions of the number, a position, a size, a numerical value, or the like can be made within a scope which does not depart from the invention. In first to third aspects, mutual characteristics or preferable examples can be used in combination with each other as long as there is no problem.

[Electrostatic Chuck Device]

Figure 1:
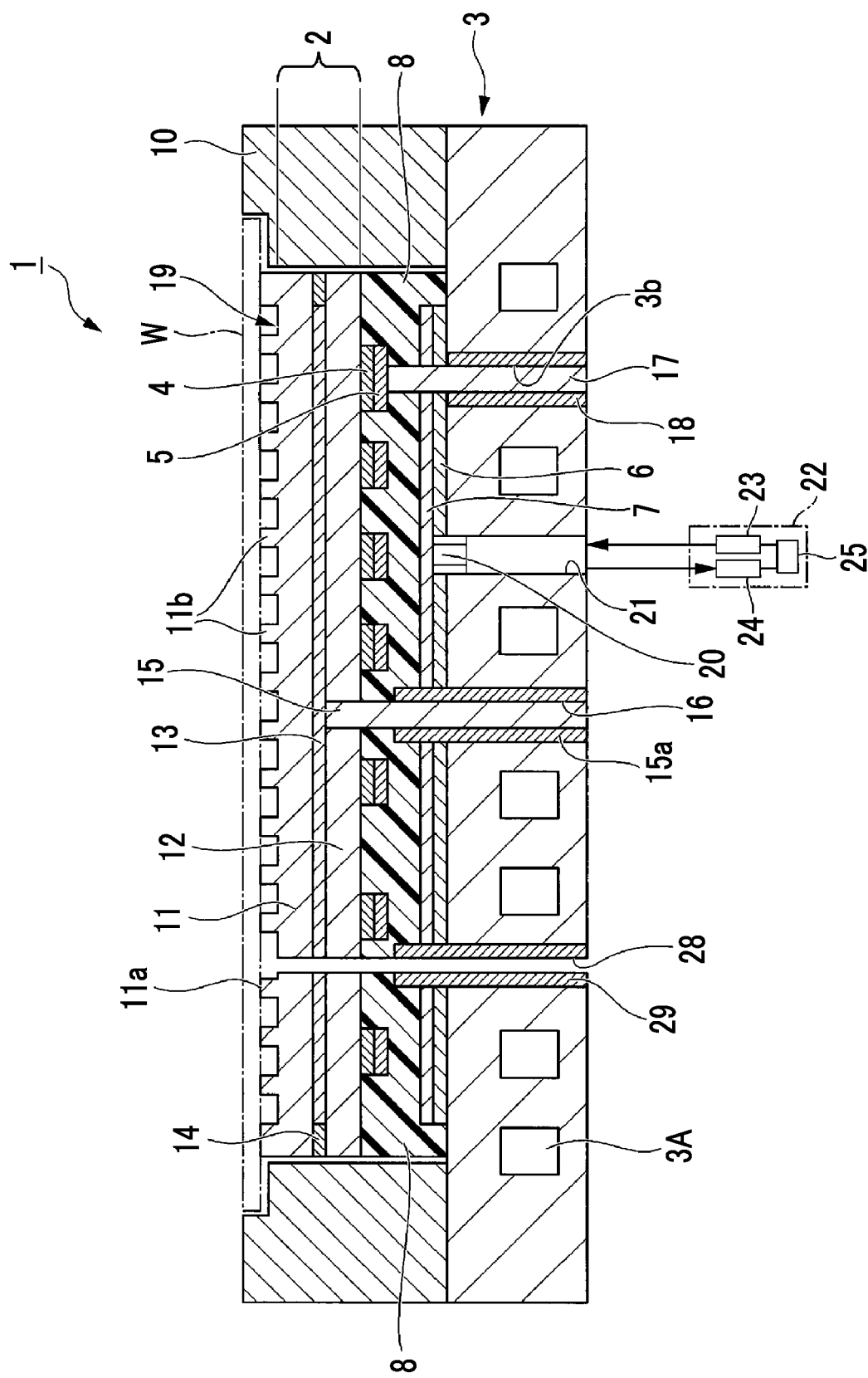
FIG. 1 is a sectional view showing an electrostatic chuck device of the present embodiment.

FIG. 1 is a sectional view showing an electrostatic chuck device of this embodiment, which is a preferred example of the present invention. An electrostatic chuck device 1 is provided with: an electrostatic chuck part 2 having a disk shape when viewed in a plan view and having a placing surface on the one principal surface (upper surface) side; and a thick temperature adjusting base part 3 which has a disk shape when viewed in a plan view and is provided below the electrostatic chuck part 2 to adjust the temperature of the electrostatic chuck part 2 to a desired temperature. Further, the electrostatic chuck part 2 and the temperature adjusting base part 3 are bonded to each other through an adhesive layer 8 provided between the electrostatic chuck part 2 and the temperature adjusting base part 3.

Hereinafter, these constituent elements will be described in order.

(Electrostatic Chuck Part)

The electrostatic chuck part 2 has a placing plate 11 having an upper surface serving as a placing surface 11a on which a plate-shaped sample W such as a semiconductor wafer is placed, a supporting plate 12 which is integrated with the placing plate 11 and supports the bottom portion side of the placing plate 11, an electrostatic attraction electrode 13 provided between the placing plate 11 and the supporting plate 12, and an insulating material layer 14 which insulates the surroundings of the electrostatic attraction electrode 13. Each of the placing plate 11 and the supporting plate 12 corresponds to a "base" in the present invention.

The placing plate 11 and the supporting plate 12 are disk-shaped members in which the shapes of superimposed surfaces are the same. Each of the placing plate 11 and the supporting plate 12 is made of a ceramic sintered compact having mechanical strength and durability against corrosive gas and plasma thereof.

The placing plate 11 and the supporting plate 12 will be described in detail later.

A plurality of projection portions 11b each having a diameter smaller than the thickness of the plate-shaped sample are formed at predetermined intervals on the placing surface 11a of the placing plate 11, and the projection portions 11b support the plate-shaped sample W.

The thickness of the entirety including the placing plate 11, the supporting plate 12, the electrostatic attraction electrode 13, and the insulating material layer 14, that is, the thickness of the electrostatic chuck part 2 is, for example, 0.7 mm or more and 5.0 mm or less.

For example, if the thickness of the electrostatic chuck part 2 is 0.7 mm or more, it is possible to sufficiently secure the mechanical strength of the electrostatic chuck part 2. If the thickness of the electrostatic chuck part 2 is 5.0 mm or less, the thermal capacity of the electrostatic chuck part 2 does not become too large and the thermal responsiveness of the plate-shaped sample W placed thereon does not deteriorate. Therefore, there is no increase in the heat transfer in a lateral direction of the electrostatic chuck part, and the in-plane temperature of the plate-shaped sample W can be maintained at a desired temperature pattern. The thickness of each part described here is an example and is not limited to the above-mentioned range.

The electrostatic attraction electrode 13 is used as an electrostatic chucking electrode for generating electric charges and fixing the plate-shaped sample W with an electrostatic attraction force. The shape or the size thereof is appropriately adjusted according to the use thereof.

The electrostatic attraction electrode 13 can be formed of a material which is arbitrarily selected. For example, the electrostatic attraction electrode 13 is preferably formed of conductive ceramics such as an aluminum oxide-tantalum carbide ($Al_2O_3$—$Ta_4C_5$) conductive compound sintered compact, an aluminum oxide-tungsten ($Al_2O_3$—W) conductive compound sintered compact, an aluminum oxide-silicon carbide ($Al_2O_3$—SiC) conductive compound sintered compact, an aluminum nitride-tungsten (AlN—W) conductive compound sintered compact, an aluminum nitride-tantalum (AlN—Ta) conductive compound sintered compact, or an yttrium oxide-molybdenum ($Y_2O_3$—Mo) conductive compound sintered compact, or high melting point metal such as tungsten (W), tantalum (Ta), or molybdenum (Mo).

The thickness of the electrostatic attraction electrode 13 is not particularly limited and can be arbitrarily selected.

For example, a thickness of 0.1 μm or more and 100 μm or less can be selected, a thickness of 1 μm or more and 50 μm or less is preferable, and a thickness of 5 μm or more and 20 μm or less is more preferable.

If the thickness of the electrostatic attraction electrode 13 is 0.1 μm or more, it is possible to secure sufficient electrical conductivity. If the thickness of the electrostatic attraction electrode 13 is 100 μm or less, cracking can be prevented from occurring in the joint interfaces between the electrostatic attraction electrode 13, and the placing plate 11 and the supporting plate 12 due to a difference in coefficient of thermal expansion between the electrostatic attraction electrode 13, and the placing plate 11 and the supporting plate 12.

The electrostatic attraction electrode 13 having such a thickness can be easily formed by a film formation method such as a sputtering method or a vapor deposition method, or a coating method such as a screen printing method.

The insulating material layer 14 surrounds the electrostatic attraction electrode 13 to protect the electrostatic attraction electrode 13 from corrosive gas and plasma thereof. Further, the insulating material layer 14 joins and integrates a boundary portion between the placing plate 11 and the supporting plate 12, that is, an outer peripheral portion region except for the electrostatic attraction electrode 13. The insulating material layer 14 is formed of an insulating material having the same composition or the same main component as the material configuring the placing plate 11 and the supporting plate 12.

(Temperature Adjusting Base Part)

The temperature adjusting base part 3 is for adjusting the temperature of the electrostatic chuck part 2 to a desired temperature and is a thick disk-shaped member. As the temperature adjusting base part 3, for example, a liquid-cooling base or the like, in which a flow path 3A for circulating a coolant in the interior thereof is formed, is suitable.

As a material configuring the temperature adjusting base part 3, as long as it is metal which has excellent thermal conductivity, electrical conductivity, and workability, or a compound material which includes the metal, it can be selected without particular limitation. For example, aluminum (Al), an aluminum alloy, copper (Cu), a copper alloy, stainless steel (SUS), or the like is suitably used. It is preferable that at least the surface which is exposed to plasma, of the temperature adjusting base part 3, is subjected to alumite treatment or has an insulating film such as alumina formed thereon.

An insulating plate 7 is bonded to the upper surface side of the temperature adjusting base part 3 through an adhesion layer 6. The adhesion layer 6 is made of a material which is arbitrarily selected, for example, a sheet-shaped or film-shaped adhesive resin having heat resistance and insulating properties, such as polyimide resin, silicone resin, or epoxy resin. The thickness of the adhesion layer can be arbitrarily selected, and the adhesion layer is formed in a thickness in a range of about 5 μm to 100 μm, for example. The insulating plate 7 is made of a thin plate, a sheet, or a film of a material which is arbitrarily selected, for example, heat-resistant resin such as polyimide resin, epoxy resin, or acrylic resin.

The insulating plate 7 may be an insulating ceramic plate instead of a resin sheet, or may be a thermally sprayed film having insulating properties, such as alumina.

(Focus Ring)

A focus ring 10 is a member that has a ring shape when viewed in a plan view and is placed on a peripheral portion of the temperature adjusting base part 3. The focus ring 10 is formed of a material which is arbitrarily selected, and it is preferable that, for example, a material having electrical conductivity equivalent to that of a wafer which is placed on the placing surface is used as a forming material. By disposing the focus ring 10, it is possible to make an electrical environment with respect to plasma substantially coincide with that in the wafer at a peripheral portion of the wafer, and thus it is possible to make it difficult for a difference or bias in plasma treatment to occur between the central portion and the peripheral portion of the wafer.

(Other Members)

A power supply terminal 15 for applying a direct-current voltage to the electrostatic attraction electrode 13 is connected to the electrostatic attraction electrode 13. The power supply terminal 15 is inserted into a through-hole 16 penetrating the temperature adjusting base part 3, the adhesive layer 8, and the supporting plate 12 in a thickness direction. An insulator 15a having insulating properties is provided on the outer periphery side of the power supply terminal 15, and the power supply terminal 15 is insulated from the temperature adjusting base part 3 made of metal, by the insulator 15a.

In FIG. 1, the power supply terminal 15 is shown as an integral member. However, the power supply terminal 15 may be configured by electrically connecting a plurality of members. The power supply terminal 15 is inserted into the temperature adjusting base part 3 and the supporting plate 12, which have different coefficients of thermal expansion. For this reason, it is preferable that, for example, a portion which is inserted into the temperature adjusting base part 3 and a portion which is inserted into the supporting plate 12 are made of different materials.

As the material of the portion (extraction electrode) connected to the electrostatic attraction electrode 13 and inserted into the supporting plate 12, of the power supply terminal 15, as long as it is a conductive material having excellent heat resistance, there is no particular limitation. For example, a material having a coefficient of thermal expansion which is close to the coefficients of thermal expansion of the electrostatic attraction electrode 13 and the supporting plate 12 is preferable. For example, it is made of a conductive ceramic material such as $Al_2O_3$—TaC.

It is preferable that the portion inserted into the temperature adjusting base part 3, of the power supply terminal 15, is made of a metal material such as tungsten (W), tantalum (Ta), molybdenum (Mo), niobium (Nb), or a Kovar alloy, for example.

It is favorable if these two members are connected to each other with a silicone-based conductive adhesive having flexibility and resistance to electricity.

A heater element 5 is provided on the lower surface side of the electrostatic chuck part 2. The structure or the material of the heater element 5 can be arbitrarily selected. For example, the heater element 5 is obtained by processing a nonmagnetic metal thin plate, for example, a titanium (Ti) thin plate, a tungsten (W) thin plate, a molybdenum (Mo) thin plate, or the like, having a constant thickness of 0.2 mm or less, preferably about 0.1 mm, into a desired heater shape, for example, a shape in which a band-like conductive thin plate meanders and the entire contour is an annular shape, by a photolithography method or laser processing.

The heater element 5 may be provided by bonding a nonmagnetic metal thin plate to the electrostatic chuck part 2 and then processing and forming the nonmagnetic metal thin plate on the surface of the electrostatic chuck part 2. The heater element 5 may be provided by transfer-printing the heater element 5 separately processed and formed at a position different from the electrostatic chuck part 2 onto the surface of the electrostatic chuck part 2.

The heater element 5 is bonded and fixed to the bottom surface of the supporting plate 12 by an adhesion layer 4 made of a sheet-shaped or film-shaped silicone resin, acrylic resin or the like having a uniform thickness and having heat resistance and insulating properties.

A power supply terminal 17 for supplying electric power to the heater element 5 is connected to the heater element 5. As the material configuring the power supply terminal 17, a material equivalent to the material configuring the power supply terminal 15 described above can be preferably used. The power supply terminal 17 is provided so as to pass through a through-hole 3b formed in the temperature adjusting base part 3.

A temperature sensor 20 is provided on the lower surface side of the heater element 5. In the electrostatic chuck device 1 of this example, an installation hole 21 is formed so as to penetrate the temperature adjusting base part 3 and the insulating plate 7 in the thickness direction, and the temperature sensor 20 is installed at the uppermost portion of the installation hole 21. It is preferable that the temperature sensor 20 is installed at a position as close to the heater element 5 as possible. For this reason, the installation hole 21 may be formed to extend so as to protrude further toward the adhesive layer 8 side than in the structure shown in the drawing such that the temperature sensor 20 and the heater element 5 are brought closer to each other.

The temperature sensor 20 can be arbitrarily selected and is, for example, a fluorescent emission type temperature sensor in which a phosphor layer is formed on the upper surface side of a rectangular parallelepiped-shaped light transmission body made of quartz glass or the like. The temperature sensor 20 is bonded to the lower surface side of the heater element 5 by a silicone resin-based adhesive or the like having translucency and heat resistance.

The phosphor layer is made of a material that generates fluorescence in response to heat input from the heater element 5. As the material for forming the phosphor layer, it can be arbitrarily selected as long as it is a material generating fluorescence in response to heat generation, and it can be selected from a wide variety of fluorescent materials. As the material for forming the phosphor layer, a fluorescent material to which a rare earth element having an energy level suitable for light emission is added, a semiconductor material such as AlGaAs, a metal oxide such as a magnesium oxide, and a mineral such as ruby or sapphire can be given as an example. A material appropriately selected from these materials can be used.

The temperature sensor 20 corresponding to the heater element 5 is provided at an arbitrary position which does not interfere with the power supply terminals or the like and is in a circumferential direction of the lower surface of the heater element 5.

A temperature measurement part 22 which measures the temperature of the heater element 5 from the fluorescence of the temperature sensor 20 can be arbitrarily selected and can be configured of, for example, an excitation unit 23 which irradiates the phosphor layer with excitation light on the outside (the lower side) of the installation hole 21 of the temperature adjusting base part 3, a fluorescence detector 24 which detects the fluorescence emitted from the phosphor layer, and a control unit 25 which controls the excitation unit 23 and the fluorescence detector 24 and calculates the temperature of a main heater on the basis of the fluorescence.

The electrostatic chuck device 1 has a pin insertion hole 28 provided so as to penetrate from the temperature adjusting base part 3 to the placing plate 11 in the thickness direction thereof. A lift pin for removal of the plate-shaped sample is inserted into the pin insertion hole 28. A tubular insulator 29 is provided at an inner peripheral portion of the pin insertion hole 28.

The electrostatic chuck device 1 has a gas hole (not shown) provided so as to penetrate from the temperature adjusting base part 3 to the placing plate 11 in the thickness direction thereof. The gas hole can adopt the same configuration as the pin insertion hole 28, for example. Cooling gas for cooling the plate-shaped sample W is supplied to the gas hole. The cooling gas is supplied to grooves 19 which are formed between the plurality of projection portions 11b on the upper surface of the placing plate 11 through the gas hole, and cools the plate-shaped sample W.

The electrostatic chuck device 1 has the configuration as described above.

(Base)

Next, preferred examples or features of the bases (the placing plate 11 and the supporting plate 12) according to the first to third aspects of the present invention will be described in more detail.

Each of the placing plate 11 and the supporting plate 12 is formed by using a sintered compact of ceramic particles which include silicon carbide particles and aluminum oxide particles as a forming material.

In the present invention, the proportion of the silicon carbide particles and the aluminum oxide particles can be arbitrarily selected. However, it is preferably in a range from 99:1 to 80:20, more preferably, in a range from 97:3 to 85:15, and even more preferably, in a range from 92:8 to 87:13, at a mass ratio. The average particle diameter of the aluminum oxide particles can be arbitrarily selected. However, it is preferably 0.2 µm or less. The average particle diameter of the silicon carbide particles can be arbitrarily selected. However, it is preferably 0.6 µm or less.

In SiC (silicon carbide), a large number of crystal structures are known. Silicon carbide having a 3C type (zincblende type) crystal structure in a cubic system, silicon carbide having a wurtzite type crystal structure in a hexagonal system of a 4H type, a 6H type, or the like, silicon carbide having a 15R type crystal structure in a rhombohedral system, or the like can be given as an example. Among these, the silicon carbide having a 3C type crystal structure is referred to as "β-SiC". Further, all the silicon carbides having crystal structures other than the 3C type crystal structure are referred to as "α-SiC".

In the placing plate 11 and the supporting plate 12, it is preferable that SiC which is included in the sintered compact is β-SiC. Further, in the sintered compact, it is preferable that crystal grains of β-SiC are present to be dispersed in a state of being surrounded by crystal grains of aluminum oxide which is a matrix material. In the sintered compact, the volume ratio of β-SiC is preferably 4% by volume or more and 15% by volume or less of the whole, more preferably 6% by volume or more and 10% by volume or less.

As a substance other than SiC which is included in the sintered compact, it can be arbitrarily selected, and $Y_2O_3$ or the like can be given as an example.

If the volume ratio of β-SiC is 4% by volume or more, a sufficient expression effect of electron conductivity by SiC particles is obtained. Further, if the volume ratio of β-SiC is 15% by volume or less, there is no concern that the SiC particles may come into contact with each other to cause a decrease in resistance value through the SiC particles.

In the sintered compact, the amount of metal impurities other than aluminum and silicon is 100 ppm or less. The amount of metal impurities is preferably 50 ppm or less and more preferably 25 ppm or less.

In the present invention, the volume resistivity value or the dielectric breakdown strength can be adjusted by controlling the amount of metal impurities in the aluminum oxide. In a case where the amount of impurities in the aluminum oxide is large, the covalent bonding property of the aluminum oxide decreases and lattice defects increase. In this way, the volume resistivity value or the dielectric breakdown strength of the aluminum oxide at a high temperature decrease.

For this reason, by suppressing the amount of metal impurities other than aluminum and silicon in the aluminum oxide to 100 ppm or less, it is possible to increase the volume resistivity value of the aluminum oxide at a high temperature. As a result, it is possible to adjust the volume resistivity value at a high temperature or the dielectric breakdown strength of the sintered compact in the direction to increase it.

Preferable characteristics in the bases of the first and second aspects will be further described below. In the first aspect, the volume resistivity value of the sintered compact is $0.5 \times 10^{15}$ Ωcm or more in the entire range from 24° C. to 300° C.

Further, in a case where the temperature dependency of the volume resistivity value of the sintered compact is measured, a graph showing a relationship of the volume resistivity value of the sintered compact to a measurement temperature of the volume resistivity value of the sintered compact has the maximum value in the range from 24° C. to 300° C.

Such properties of the placing plate 11 and the supporting plate 12 can be realized by (i) an increase in the purity of the aluminum oxide particles and/or (ii) removal of crystal defects of the silicon carbide particles.

That is, if "(i) an increase in the purity of the aluminum oxide particles is performed", the ion conductivity of the aluminum oxide particles is reduced. If the ion conductivity of the aluminum oxide particles is reduced, the volume resistivity value shows a tendency to decrease due to a temperature rise. The increase in the purity of the aluminum oxide particles can be performed by a method which is selected as necessary.

On the other hand, if "(ii) removal of crystal defects of the silicon carbide particles" is performed, the electron conductivity of the silicon carbide particles is improved. If the electron conductivity of the silicon carbide particles is improved, the volume resistivity value shows a tendency to increase due to a temperature rise. The removal of crystal defects of the silicon carbide particles can be performed by a method which is selected as necessary.

In the placing plate 11 and the supporting plate 12, the volume resistivity value can be controlled according to these tendencies of the silicon carbide particles and the aluminum oxide particles configuring the sintered compact.

Figure 2:
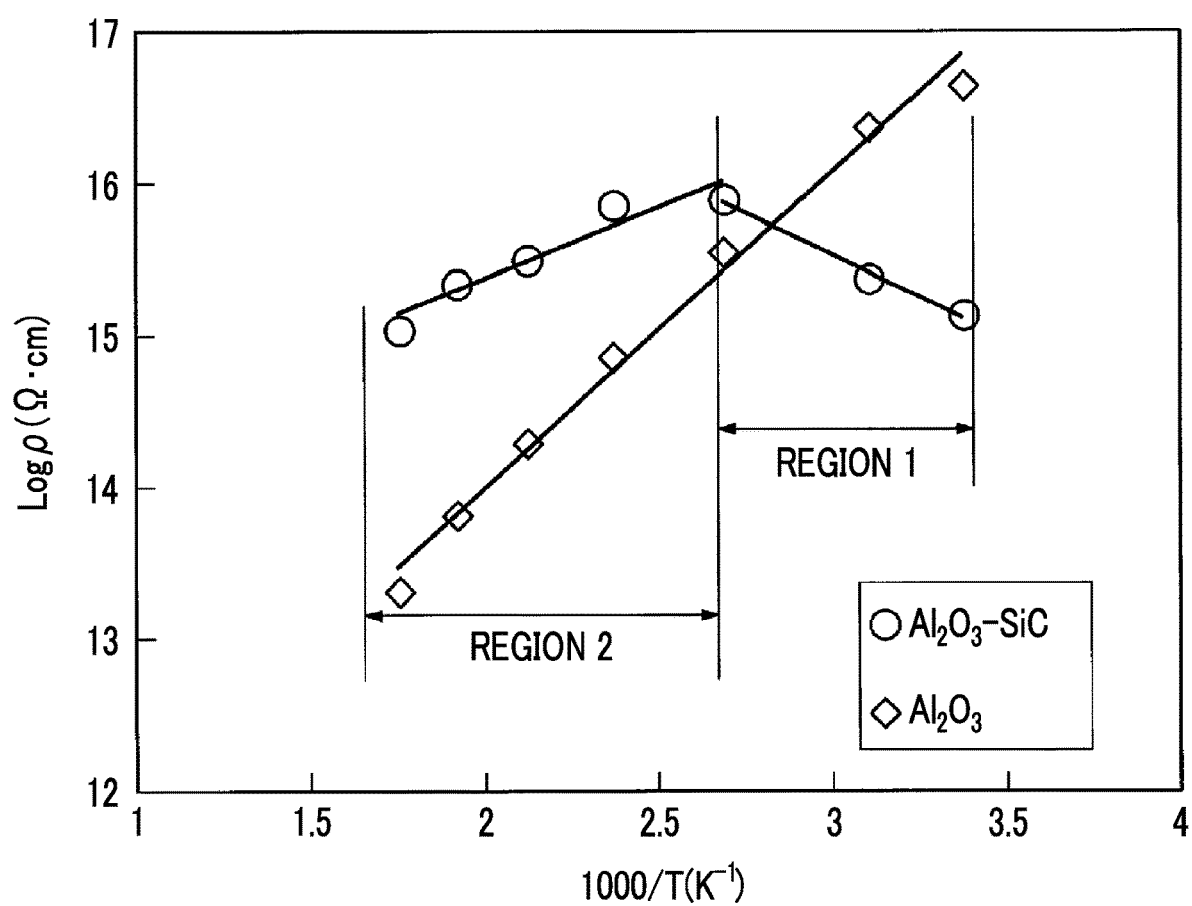
FIG. 2 is a graph schematically showing a relationship of a volume resistivity value to a measurement temperature with respect to a sintered compact configuring each of a placing plate and a supporting plate of the present embodiment.

FIG. 2 is a semi-logarithmic graph schematically showing the relationship of the volume resistivity value to the measurement temperature with respect to the sintered compact configuring each of the placing plate 11 and the supporting plate 12 in the present invention. In FIG. 2, the horizontal axis represents the reciprocal (unit: $K^{-1}$) of the measurement temperature, and the vertical axis represents the volume resistivity value (unit: $\Omega \cdot cm$). Further, FIG. 2 shows the results of the sintered compact ($Al_2O_3$—SiC) which is used in the present invention, which configures each of the placing plate 11 and the supporting plate 12, and an aluminum oxide sintered compact ($Al_2O_3$) for comparison. The measurement temperature shown in FIG. 2 is in a range of 24° C. to 300° C. (3.367 to 1.745 (1000/T($K^{-1}$)).

In FIG. 2, the impurities of the aluminum oxide sintered compact ($Al_2O_3$) for comparison are 795 ppm.

As shown in the drawing, the sintered compact which is used in the present invention and is indicated by a "circle" in the drawing has a region (region 1) where a volume resistivity value rises along with a temperature rise and a region (region 2) where a volume resistivity value decreases along with a temperature rise, in the graph. This result is different from that of the aluminum oxide sintered compact indicated by a "square", in which a volume resistivity value rises merely due to a temperature rise.

First, in the region 1, the properties of the silicon carbide particles more remarkably appear than the properties of the aluminum oxide particles, and the volume resistivity value shows a tendency to increase due to a temperature rise. On the other hand, in the region 2, the properties of the aluminum oxide particles more remarkably appear than the properties of the silicon carbide particles, and the volume resistivity value shows a tendency to decrease due to a temperature rise. In a case where the silicon carbide sintered compact is measured, the volume resistivity value decreases as a temperature rises.

In this manner, due to a difference between the properties of the two types of particles which remarkably appear according to the temperature of the sintered compact, in the sintered compact configuring each of the placing plate 11 and the supporting plate 12 in the present invention, the graph showing the relationship between the measurement temperature and the volume resistivity value shows the maximum value in the range from 24° C. to 300° C.

The "range from 24° C. to 300° C." is determined in consideration of the temperature condition of the use environment of the electrostatic chuck device. That is, in the electrostatic chuck device, in the range from room temperature (24° C.) to a temperature (300° C.) exceeding the temperature assumed as a temperature condition in a plasma treatment process, the graph showing the relationship between the measurement temperature and the volume resistivity value of the sintered compact is convex upward and shows the maximum value.

With respect to the behavior in which the graph showing the relationship between the measurement temperature and the volume resistivity value of the sintered compact, as described above, shows the maximum value, the inventors believe that it is clarified because the amount of metal impurities of the sintered compact is highly purified to 100 ppm or less.

That is, in the sintered compact, for example, by decreasing the amount of metal impurities of the aluminum oxide particles to achieve high purity, the electrical conductivity (ion conductivity) of the aluminum oxide particles is reduced and the influence of the electrical conductivity (electron conductivity) of the silicon carbide particles becomes strong. As a result, due to the balance between the behavior of the electrical conductivity (ion conductivity) of the aluminum oxide particles with respect to the measurement temperature and the behavior of the electrical conductivity (electron conductivity) of the silicon carbide particles, it is believed that the graph showing the relationship between the measurement temperature and the volume resistivity value of the sintered compact is convex upward and shows the maximum value.

In a case where the amount of metal impurities of the sintered compact is large, the clear maximum value as shown in FIG. 2 does not appear.

Preferable characteristics in the bases of the second aspect will be further described below.

In the second aspect, the dielectric breakdown strength of the sintered compact at 180° C. is at least 0.85 times the dielectric breakdown strength of the sintered compact at 24° C.

Here, in this specification, the term "dielectric breakdown strength" refers to, when a test piece of a sintered compact is clamped by electrodes each having a diameter of 25 mm and measured at a voltage increase rate of 2000 V/second in a short time test prescribed in JIS C2110-2, a value obtained by dividing a voltage value when a current value (leakage current value) flowing through the test piece is 5 mA by the thickness of the test piece.

Such dielectric breakdown strength can be measured by using a commercially available dielectric breakdown tester (for example, HAT-300-100RHO manufactured by Yamayoshikenki Co., Ltd).

Such properties of the placing plate 11 and the supporting plate 12 can be realized by highly purifying the aluminum oxide particles.

If the "increase in the purity of the aluminum oxide particles" is performed, the ion conductivity of the aluminum oxide particles is reduced. If the ion conductivity of the aluminum oxide particles is reduced, it becomes difficult for the volume resistivity value of the aluminum oxide particles to decrease due to a temperature rise.

Therefore, in the placing plate 11 and the supporting plate 12, by increasing the purity of the aluminum oxide particles configuring the sintered compact, it is easy to secure an insulating property at a high temperature (180° C.), and it is possible to obtain dielectric breakdown strength of a desired value.

[Method for Manufacturing Electrostatic Chuck Device]

A method for manufacturing an electrostatic chuck device according to the present invention includes a step of obtaining slurry by injecting aluminum oxide particles and silicon carbide particles at high speed and mixing the aluminum oxide particles and the silicon carbide particles while colliding the aluminum oxide particles and the silicon carbide particles with each other, a step of removing a dispersion medium from the slurry obtained in the mixing step and then forming a formed body, a step of pressure-sintering the obtained formed body by heating the formed body to a temperature of 1600° C. or higher while compacting the formed body with a pressure of 25 MPa or more under a non-oxidative atmosphere, and a step of grinding the obtained ceramic sintered compact to form a base (each of the placing plate 11 and the supporting plate 12).

A preferred example will be described below.

In the method for manufacturing an electrostatic chuck device according to the present invention, it is preferable that the aluminum oxide particles which are used have few impurities, that is, the content of aluminum oxide is 99.99% or more. Such high-purity aluminum oxide particles can be adjusted by using an alum method. The alum method is, for example, a method of obtaining aluminum oxide particles by synthesizing ammonium dawsonite from ammonium salt and ammonium hydrogen carbonate and calcinating the obtained ammonium dawsonite. In the aluminum oxide particles adjusted by using the alum method, the content of sodium atoms which are metal impurities can be significantly reduced compared to aluminum oxide particles adjusted by using, for example, a Bayer method. Further, various methods can be adopted as long as aluminum oxide particles having a desired purity can be obtained.

The particles or the ratio of the aluminum oxide particles and the silicon carbide particles can be arbitrarily selected, and the particle diameter described above can be preferably used. In the silicon carbide particles, it is preferable that the content of silicon carbide is 99.9% or more.

In the mixing step, the aluminum oxide particles and the silicon carbide particles, which are dispersed in a dispersion medium such as pure water which may include a dispersant as necessary, are injected at high speed by pressurizing the aluminum oxide particles and the silicon carbide particles, by using a two-stream particle collision type pulverizing and mixing apparatus, and mixed while colliding the aluminum oxide particles and the silicon carbide particles with each other.

In this way, the aluminum oxide particles and the silicon carbide particles are pulverized and dispersion liquid (slurry) containing these pulverized particles is obtained.

When colliding the aluminum oxide particles and the silicon carbide particles with each other, large particles have large kinetic energy at the time of collision and are easily pulverized. On the other hand, small particles have small kinetic energy at the time of collision and are not easily pulverized. For this reason, the aluminum oxide particles and the silicon carbide particles which are obtained by using the above-mentioned pulverizing and mixing apparatus are particles with few coarse particles or excessively pulverized particles and having a narrow particle size distribution width. Therefore, if the mixed particles pulverized and mixed by using the two-stream particle collision type pulverizing and mixing apparatus are used, abnormal grain growth with coarse particles as nuclei can be suppressed in the sintering step.

Further, in a case where pulverizing and mixing are performed by using such a pulverizing and mixing apparatus, it is possible to suppress the contamination of impurities due to breakage of each medium, compared to a method of performing pulverizing and mixing by using a medium such as a ball mill or a bead mill, for example.

Next, the dispersion medium is removed. In the forming step, first, the dispersion liquid obtained by the pulverizing and mixing apparatus is spray-dried to obtain granules composed of mixed particles of the aluminum oxide particles and the silicon carbide particles.

Subsequently, the obtained granules are formed, for example, uniaxially formed (formed with uniaxial press) according to the shape of an aimed sintered compact.

Subsequently, the obtained formed body is heated to, for example, 500° C. at normal pressure (without pressing) under an inert gas atmosphere. By the heating, contaminants such as moisture or a dispersion medium, which are included in the formed body, are removed (a formed body heating step A). The inert gas can be arbitrarily selected, and for example, nitrogen or argon can be preferably used. In this operation, as long as the contaminants can be removed from the formed body without modifying the formed body, the heating temperature is not limited to 500° C. For example, a temperature in a range of 400° C. to 600° C. can be used, a temperature in a range of 450° C. to 550° C. can be preferably used, and a temperature in a range of 500° C. to 525° C. can be more preferably used.

Further, it is preferable that the manufacturing method according to the present invention includes an oxidation step (a formed body heating step B) of performing oxidation treatment on the mixed particles configuring the formed body by heating the formed body from which the contaminants (impurities) have been removed, at a temperature at which the oxidation treatment is possible, for example, a temperature of 400° C. under the condition that the oxidation treatment is possible, for example, in the atmosphere. It is preferable not to perform pressing. According to such an operation, in the oxidation treatment, oxide films are formed on the surfaces of the silicon carbide particles which are included in the mixed particles. Metal impurities which are included in the mixed particles easily elutes to the oxide film, and therefore, metal impurities which are included in the mixed particles are present to be biased to the particle surface. Then, in a pressure-sintering step which will be described later, metal impurities can be easily removed, which is preferable. As the oxidation treatment temperature, for example, a temperature in a range of 300° C. to 600° C. can be used, a temperature in a range of 320° C. to 550° C. can be preferably used, and a temperature in a range of 350° C. to 525° C. can be more preferably used.

Next, a pressure-calcination step is performed.

In the pressure-calcination step, first, preferably, the formed body is set in a mold or the like. Thereafter, the formed body described above is heated (preliminarily heated) at a temperature lower than 1600° C. and preferably normal pressure (without pressing) (in Example 2 which is an example of Japanese Laid open Patent Publication No. 2016 067657, pressurization is performed in the preliminary heating, and therefore, the expression "preferable" is stated in the description of this paragraph) in a vacuum atmosphere (a first non-oxidative atmosphere) (a formed body heating step C). According to such operation, by appropriately setting the temperature at the time of the preliminary heating, metal impurities such as alkali metal, which are included in the mixed particles, evaporate, and thus the metal impurities can be easily removed. For this reason, according to such an operation, the purity of the mixed particles is easily improved, and thus it becomes easy to control the volume resistivity value of the base.

The preliminary heating time can also be arbitrarily selected. If necessary, in the preliminary heating, pressing may be performed at a pressure lower than the pressure which is used in the pressure calcination.

Further, as described above, if the oxidation treatment is performed on the formed body from which contaminants have been removed, the oxide film formed on the particle surface is volatilized by performing the preliminary heating under a vacuum atmosphere in the forming step. At the same time, the metal impurities included in the oxide film evaporate. For this reason, the metal impurities can be easily removed from the formed body. Therefore, according to such an operation, the purity of the mixed particles is easily improved, and thus it becomes easy to control the volume resistivity value of the base.

In the present invention, the term "vacuum" refers to a "state in a space filled with a base and having a pressure lower than the atmospheric pressure" and a state defined as an industrially usable pressure in the JIS standard. In the present invention, the vacuum atmosphere may be low vacuum (100 Pa or higher). However, medium vacuum (in a range of 0.1 Pa to 100 Pa) is preferable, and high vacuum (in a range of $10^{-5}$ Pa to 0.1 Pa) is more preferable.

In the method for manufacturing an electrostatic chuck device of this example, for example, after the preliminary heating is performed at 1200° C. for 4 hours or more under a vacuum atmosphere, air pressure is returned to the atmospheric pressure with argon.

Subsequently, the formed body subjected to the preliminary heating is further treated by pressure-calcination (a heating step D). The condition of the pressure-calcination is arbitrarily selected. For example, the formed body is pressure-sintered by heating the formed body to 1600° C. or higher while compacting it with a pressure of 5 MPa or more in an argon atmosphere (a second non-oxidative atmosphere). According to such an operation, sintering of the aluminum oxide particles or the silicon carbide particles which are included in the formed body progresses, and thus a dense sintered compact having few pores is obtained.

In the method for manufacturing an electrostatic chuck device of this embodiment, sintering is performed under a non-oxidative atmosphere, for example, an argon atmosphere, at a temperature of 1600° C. or more and 1850° C. or less and a sintering pressure of 25 MPa or more and 50 MPa or less. However, there is no limitation to only this condition.

In the sintered compact obtained by being manufactured by such a method, the amount of metal impurity is reduced, and thus the sintered compact having high purity is obtained. In a case where the amount of metal impurities does not reach the target value, it is favorable if the preliminary heating time is lengthened or the preliminary heating temperature is increased.

Subsequently, in the step of forming the base, the obtained sintered compact is ground to form a base having a desired shape.

According to the electrostatic chuck device configured as described above, it is possible to provide an electrostatic chuck device in which removal of the wafer is easy even at the time of high-temperature heating.

Further, according to the method for manufacturing an electrostatic chuck device as described above, it is possible to easily manufacture an electrostatic chuck device in which removal of the wafer is easy even at the time of high-temperature heating.

The preferred embodiment of the present invention has been described above with reference to the accompanying drawings. However, it goes without saying that the present invention is not limited to such an example. The shapes, combinations, or the like of the respective constituent members shown in the example described above are merely examples, and various changes can be made based on design requirements or the like within a scope which does not depart from the gist of the present invention.

EXAMPLES

Hereinafter, the present invention will be described with examples. However, the present invention is not limited to these examples.

Example 1

As a starting material, β-SiC type silicon carbide (β-SiC) particles having an average particle diameter of 0.03 μm and synthesized by thermal plasma CVD, and aluminum oxide ($Al_2O_3$) particles having an average particle diameter of 0.1 μm and the amount of metal impurity of 95 ppm were used.

Weighing was performed such that with respect to the total amount of the β-SiC particles and the $Al_2O_3$ particles, the β-SiC particles are 8% by mass and the $Al_2O_3$ particles are 92% by mass. 800 g of β-SiC particles and 9200 g of $Al_2O_3$ particles were put in 7250 cc of distilled water containing a dispersant. The dispersion liquid with the β-SiC particles and the $Al_2O_3$ particles put therein was subjected to dispersion treatment by an ultrasonic dispersing apparatus and then pulverized and mixed by using a two-stream particle collision type pulverizing and mixing apparatus.

The obtained mixed solution (slurry) was spray-dried with a spray dryer to obtain mixed particles of the β-SiC particles and the $Al_2O_3$ particles.

The mixed particles were subjected to uniaxial press forming at a pressing pressure of 8 MPa to obtain a formed body having a diameter of 320 mm and a thickness of 15 mm.

Subsequently, the formed body was heated to 500° C. under a nitrogen atmosphere without applying a pressing pressure thereto to remove moisture and the dispersant (contaminants). Thereafter, the formed body with the contaminants removed therefrom was heated to 400° C. in the atmosphere to oxidize the surfaces of the β-SiC particles which are included in the formed body.

The obtained formed body was set in a graphite mold and pressure-sintering was performed. First, the formed body was heated to 1200° C. under a vacuum atmosphere without applying a pressing pressure thereto (preliminary heating). Thereafter, sintering was performed at a pressing pressure of 40 MPa and a temperature of 1800° C. under an argon atmosphere to obtain a sintered compact of Example 1.

The amount of metal impurities of the sintered compact of Example 1 was 80 ppm. In this example, the value measured by an ICP-MS method was adopted as the amount of metal impurities.

In Example 1, the volume resistivity value of a disk-shaped sintered compact was measured by a direct-current three-terminal method as follows.

(Used Equipment)

Screen printer: MODEL MEC-2400 type manufactured by Mitani Micronics Co., Ltd.

Resistivity measuring device: manufactured by NISHIYAMA-SEISAKUSHO Co., Ltd.

Insulation meter: digital insulation meter (Model DSM-8103, HIOKI E.E. Corporation)

(Measurement Condition)

Temperature: room temperature (24° C.), 50° C., 100° C., 150° C., 200° C., 250° C., 300° C.

Atmosphere: nitrogen (purity: 99.99995%, flow rate: 200 ml/min.)

Applied voltage: 0.5 kV, 1 kV (Measuring Method)

Figure 3:
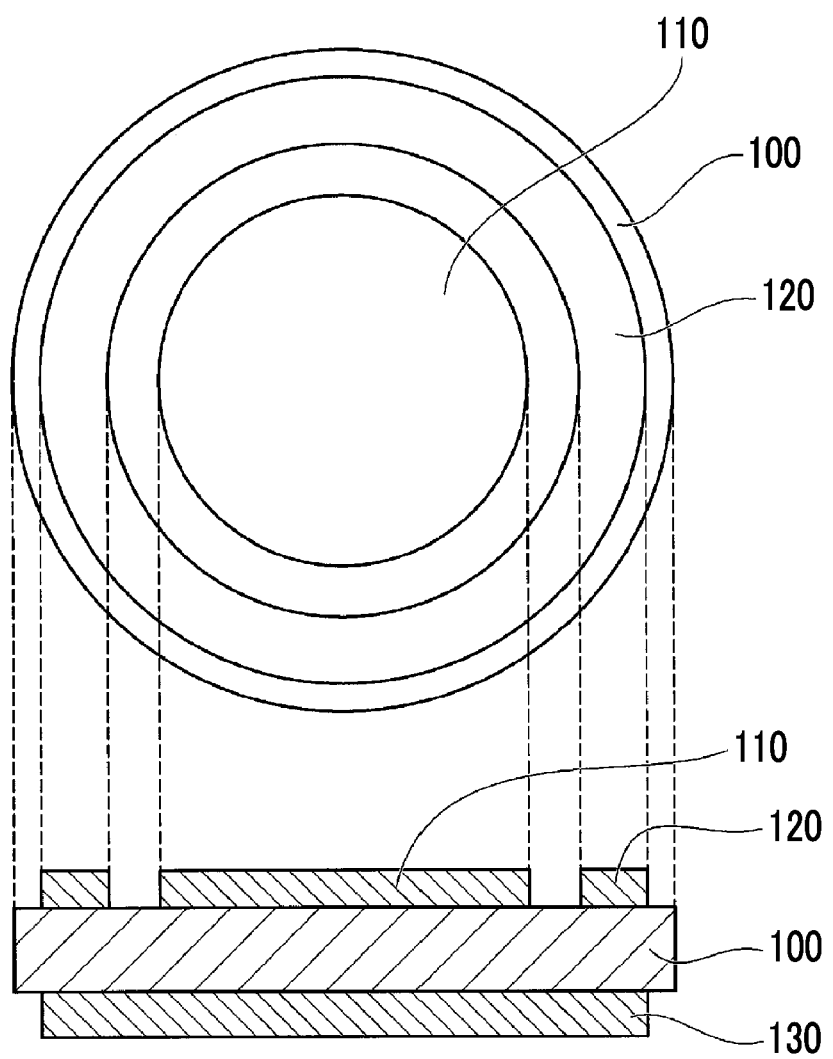
FIG. 3 is a schematic diagram showing a state of a sintered compact when measuring the volume resistivity value in an example.

Silver paste (NP-4635 manufactured by Noritake Co., Ltd.) was printed on the upper and lower surfaces of the sintered compact by using the screen printer, dried at 100° C. for 12 hours in the atmosphere, and then baked at 450° C. for 1 hour in the atmosphere to form a main electrode, a guard electrode, and a counter electrode. FIG. 3 is a schematic diagram showing a state of the sintered compact when measuring the volume resistivity value in this example. In the drawing, reference numeral 100 denotes the sintered compact, reference numeral 110 denotes the main electrode, reference numeral 120 denotes the guard electrode, and reference numeral 130 denotes the counter electrode.

At this time, the diameter of the main electrode was 1.47 cm, and the inner diameter of the guard electrode was 1.60 cm.

A direct-current voltage was applied to the sintered compact with the electrodes formed thereon as described above, at each measurement temperature, and an electric current after charging for 1 minute was measured to obtain the volume resistance of the sintered compact. Thereafter, a volume resistivity (ρv) was calculated from the following expression (1) by using the thickness of the sintered compact and the areas of the electrodes.

$$\rho v = S/t \times Rv = S/t \times V/I \quad (1)$$

(S: effective area (cm$^2$) of an electrode, t: thickness (cm) of a sintered compact, Rv: volume resistance, V: direct-current voltage (V), I: electric current (A))

Example 2

As a starting material, β-SiC type silicon carbide (β-SiC) particles having an average particle diameter of 0.03 μm and synthesized by thermal plasma CVD, and aluminum oxide (Al$_2$O$_3$) particles having an average particle diameter of 0.1 μm were used. The amount of metal impurities of the β-SiC particles was 50 ppm. Further, the amount of metal impurities of the Al$_2$O$_3$ particles was 150 ppm.

Weighing was performed such that with respect to the total amount of the β-SiC particles and the Al$_2$O$_3$ particles, the β-SiC particles are 8% by volume and the Al$_2$O$_3$ particles are 92% by mass. 800 g of β-SiC particles and 9200 g of Al$_2$O$_3$ particles were put in 7250 cc of distilled water containing a dispersant.

The dispersion liquid with the β-SiC particles and the Al$_2$O$_3$ particles put therein was subjected to dispersion treatment by an ultrasonic dispersing apparatus and then pulverized and mixed using a two-stream particle collision type pulverizing and mixing apparatus.

The obtained mixed solution was spray-dried with a spray dryer to obtain mixed particles of the β-SiC particles and the Al$_2$O$_3$ particles.

The mixed particles were subjected to uniaxial press forming at a pressing pressure of 8 MPa to obtain a formed body having a diameter of 320 mm and a thickness of 15 mm.

Subsequently, the formed body was heated to 500° C. under a nitrogen atmosphere without applying a pressing pressure thereto to remove moisture and the dispersant (contaminants). Thereafter, the formed body with the contaminants removed therefrom was heated to 400° C. in the atmosphere to oxidize the surfaces of the β-SiC particles included in the formed body.

The obtained formed body was set in a graphite mold and pressure-sintering was performed. The sintering condition was set to be a pressing pressure of 5 MPa under a vacuum atmosphere up to 1100° C. Thereafter, sintering was performed at a pressing pressure of 40 MPa and a temperature of 1800° C. under an argon atmosphere to obtain a sintered compact of Example 2.

The amount of metal impurities of the sintered compact of Example 2 was 50 ppm. In this example, the value measured by an ICP-MS method was adopted as the amount of metal impurities.

Subsequently, the surface of the sintered compact was ground to obtain a test piece of Example 2 having a thickness of 1 mm.

Example 3

A test piece of Example 3 was obtained in the same manner as in Example 1 except that a thickness was set to be 0.5 mm, by grind the surface of the sintered compact.

Example 4

A test piece of Example 4 was obtained in the same manner as in Example 2 except that a thickness was set to be 0.3 mm, by grind the surface of the sintered compact.

Comparative Example 1

As the Al$_2$O$_3$ particles, Al$_2$O$_3$ particles having the amount of metal impurities of 800 ppm and an average particle diameter of 0.5 μm were used. The total amount of the particles which are used in the formed body was the same as in Examples 1 or 2. Further, a sintered compact of Comparative Example 1 was obtained in the same manner as in Example 1 except that heat treatment (sintering) was performed on the formed body with the contaminants removed therefrom under an argon atmosphere without exposing the formed body to a vacuum atmosphere from room temperature to a sintering temperature.

The amount of metal impurities of the sintered compact of Comparative Example 1 was 795 ppm.

Reference Example 1

As a starting material, Al$_2$O$_3$ particles having an average particle diameter of 1.0 μm and the amount of metal impurities of 1500 ppm and magnesium oxide (MgO) particles were used.

Weighing was performed such that with respect to the total amount of the MgO particles and the Al$_2$O$_3$ particles, the MgO particles are 0.04% by mass and the Al$_2$O$_3$ particles are 99.96% by mass. 4 g of MgO particles and 9996 g of Al$_2$O$_3$ particles were put in distilled water containing a dispersant and mixed for 16 hours.

The obtained mixed solution was spray-dried with a spray dryer to obtain mixed particles of the MgO particles and the Al$_2$O$_3$ particles.

CIP (Cold Isostatic Pressing) was performed on the obtained mixed particles at a pressing pressure of 98 MPa to obtain a formed body having a diameter of 320 mm and a thickness of 15 mm.

Subsequently, the formed body was maintained at 500° C. for 5 hours under the air atmosphere and then sintered at 1650° C. for 4 hours to obtain a sintered compact of Reference Example 1.

The amount of metal impurities of the sintered compact of Reference Example 1 was 1900 ppm.

Subsequently, the surface of the sintered compact of Reference Example 1 was ground to obtain a test piece of Reference Example 1 having a thickness of 1 mm.

(Dielectric Breakdown Strength)

In Examples 2 to 4, the dielectric breakdown strength of the obtained test pieces was obtained by using measurement values measured with a dielectric breakdown tester (HAT-300-100RHO manufactured by Yamayoshikenki Co., Ltd).

Specifically, when the test piece of the sintered compact is clamped by electrodes each having a diameter of 25 mm and measured at a voltage increase rate of 2000 V/second in a short time test prescribed in JIS C 2110-2, a value obtained by dividing a voltage value when a current value (leakage current value) flowing through the test piece is 5 mA by the thickness of the test piece was obtained as the dielectric breakdown strength.

The dielectric breakdown strength was measured at 23° C., 100° C., and 180° C. Other measurement conditions are as follows.

(Measurement Conditions)

Sample surrounding medium: 23° C. transformer oil, 100° C., 180° C. . . . silicone oil Test environment temperature: 23° C.±2° C.

Test environment humidity: 50% RH±5% RH

Hereinafter, the results of the examples and the comparative example will be described.

Figure 4:
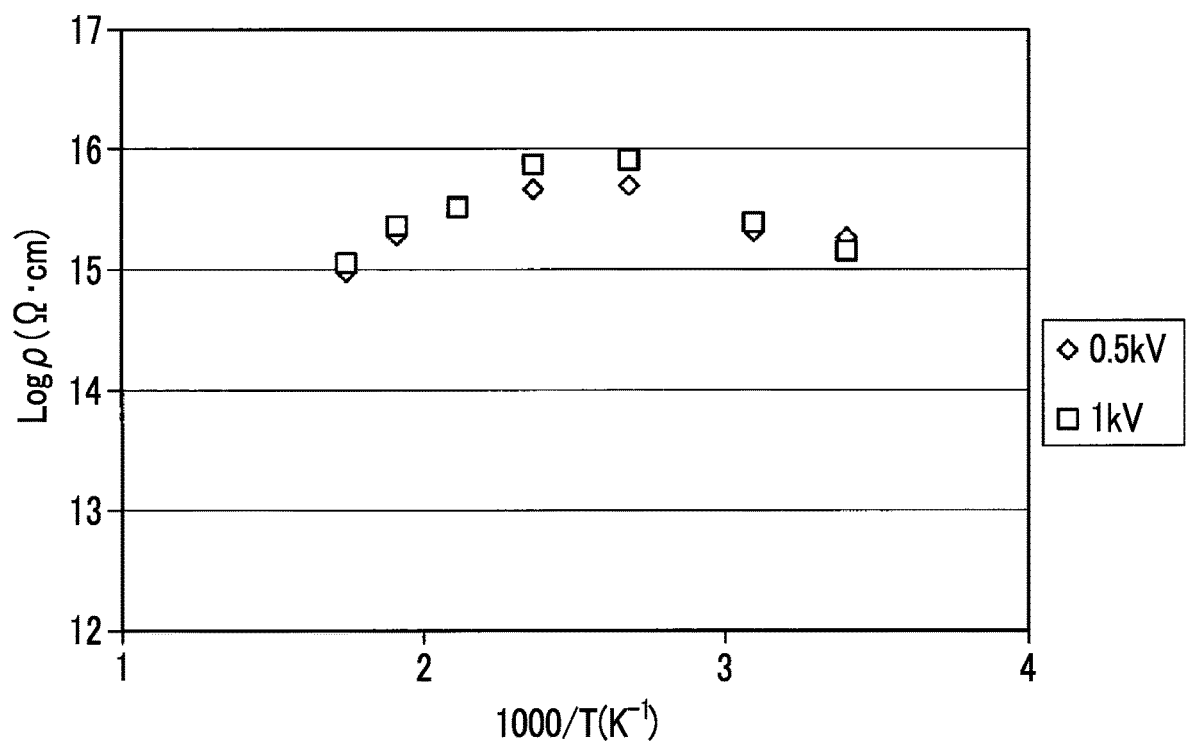
FIG. 4 is a graph showing the results of Example 1.
Figure 5:
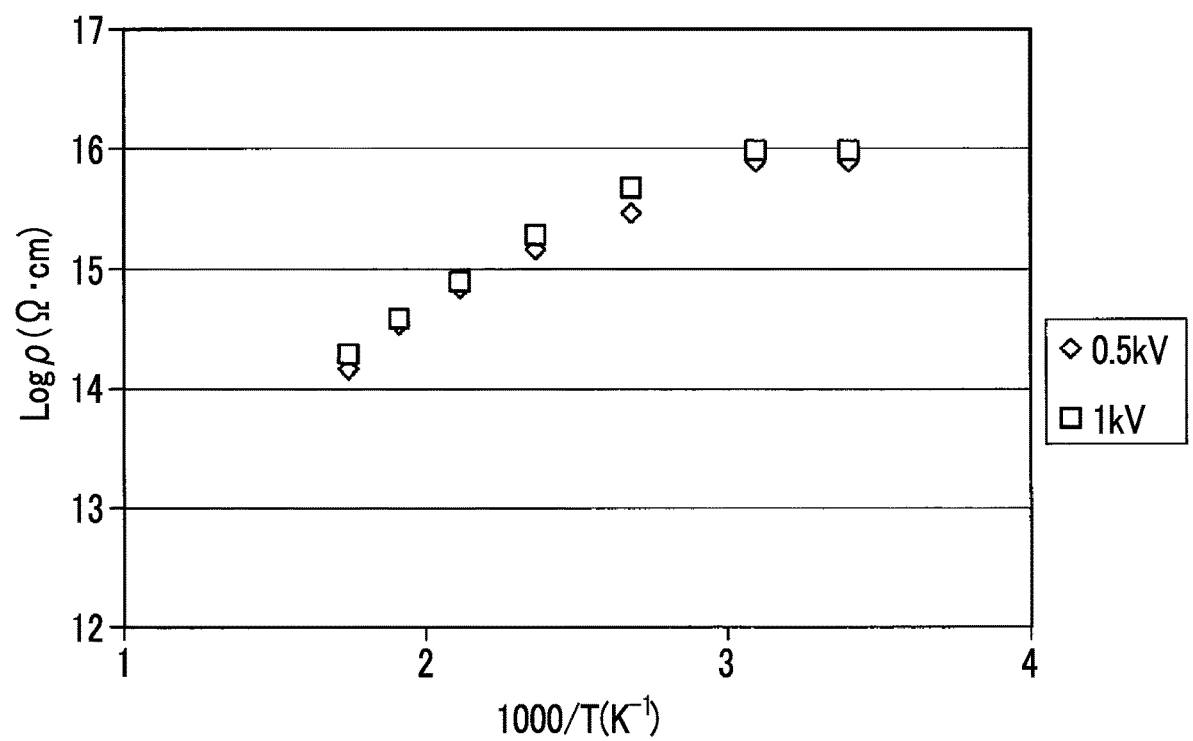
FIG. 5 is a graph showing the results of Comparative Example 1.
Figure 6:
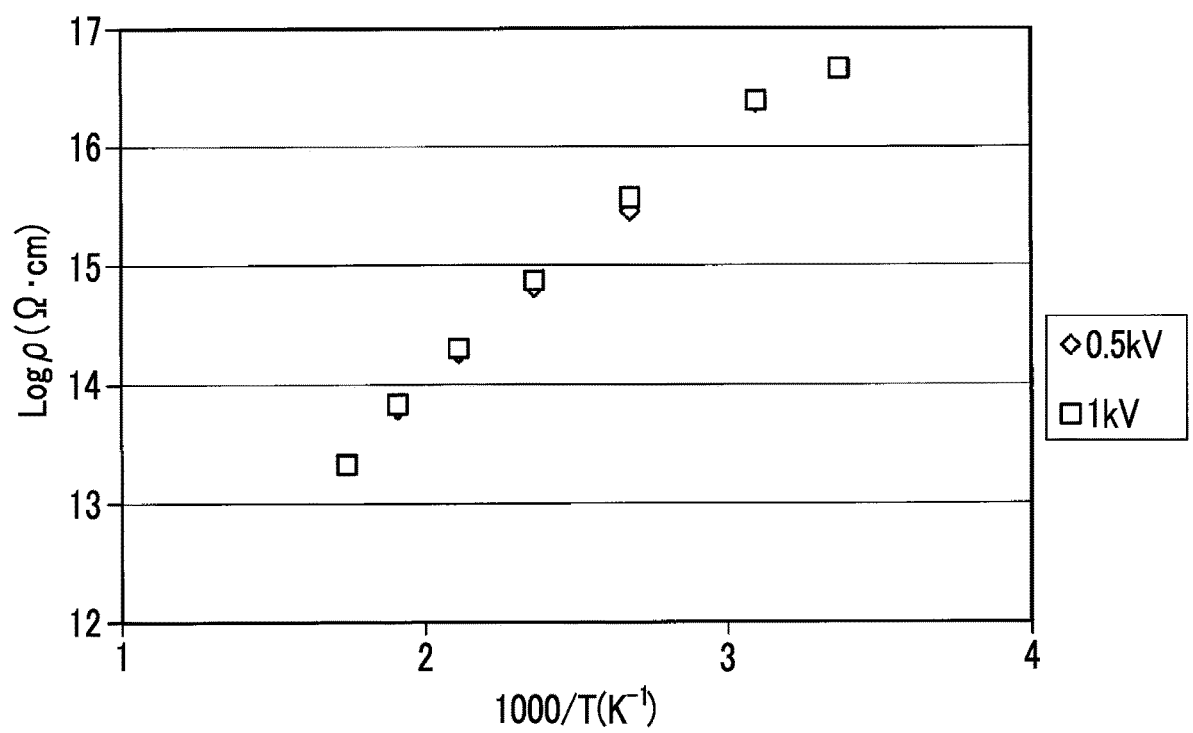
FIG. 6 is a graph showing the results of Reference Example 1.

FIG. 4 is a graph showing the results of Example 1, FIG. 5 is a graph showing the results of Comparative Example 1, and FIG. 6 is a graph showing the results of Reference Example 1. In FIGS. 4 to 6, the horizontal axis represents the reciprocal (unit: $K^{-1}$) of the measurement temperature, and the vertical axis represents the volume resistivity value (unit: Ω·cm).

As shown in FIG. 4, it was found that the sintered compact of Example 1 had a volume resistivity value of $0.5 \times 10^{15}$ Ωcm or more in the entire range from 24° C. to 300° C. and had a maximum value in the range from 24° C. to 300° C. in the graph shown in FIG. 4.

In contrast, as shown in FIG. 5, it was found that the sintered compact of Comparative Example 1 had a volume resistivity value falling below $0.5 \times 10^{15}$ Ωcm in a high-temperature range.

As shown in FIG. 6, it was found that the sintered compact of Reference Example 1 did not have the maximum value in the range from 24° C. to 300° C.

According to the electrostatic chuck device using the sintered compact shown in Example 1 as the base, it becomes easy to remove the wafer even at the time of high-temperature heating.

Figure 7:
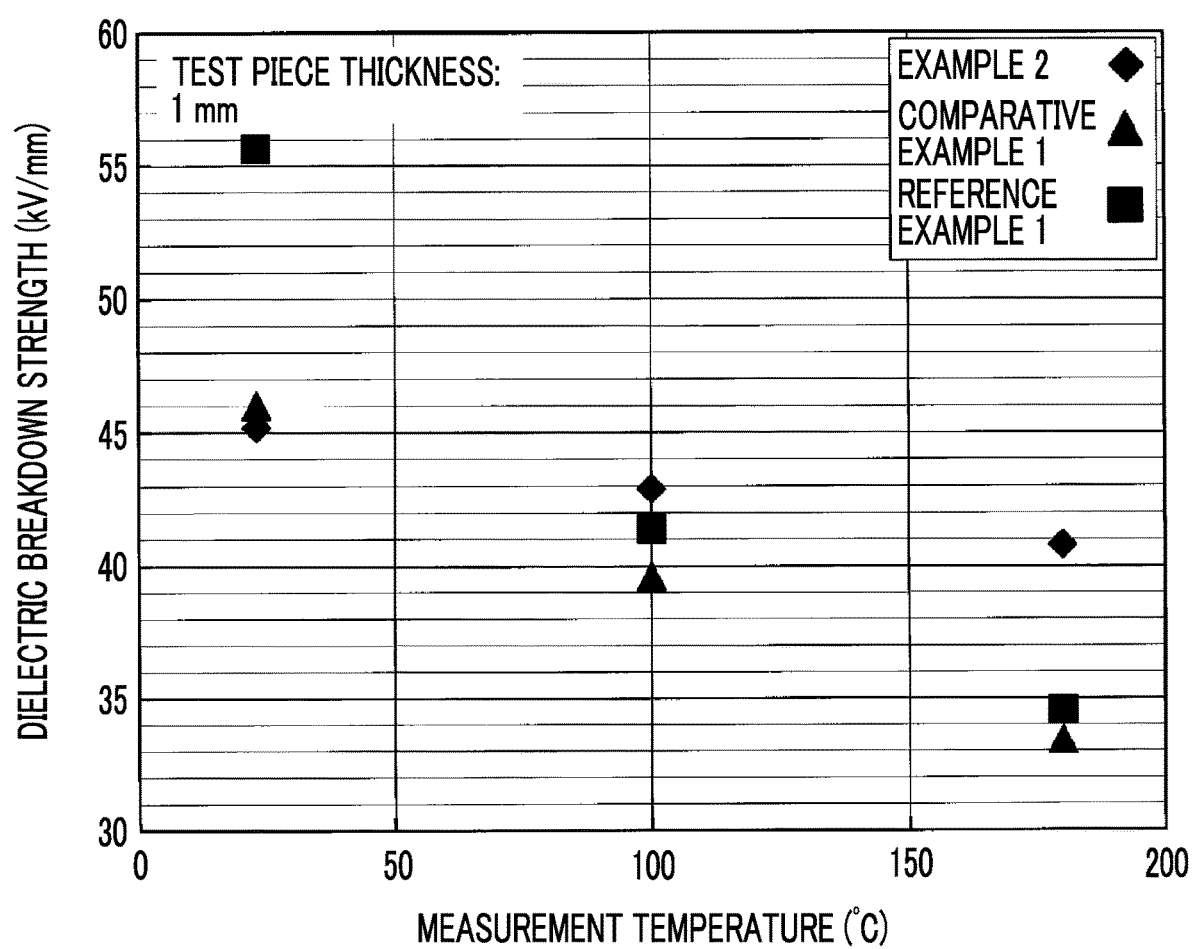
FIG. 7 is a graph showing the results of Example 2, Comparative Example 1, and Reference Example 1.
Figure 8:
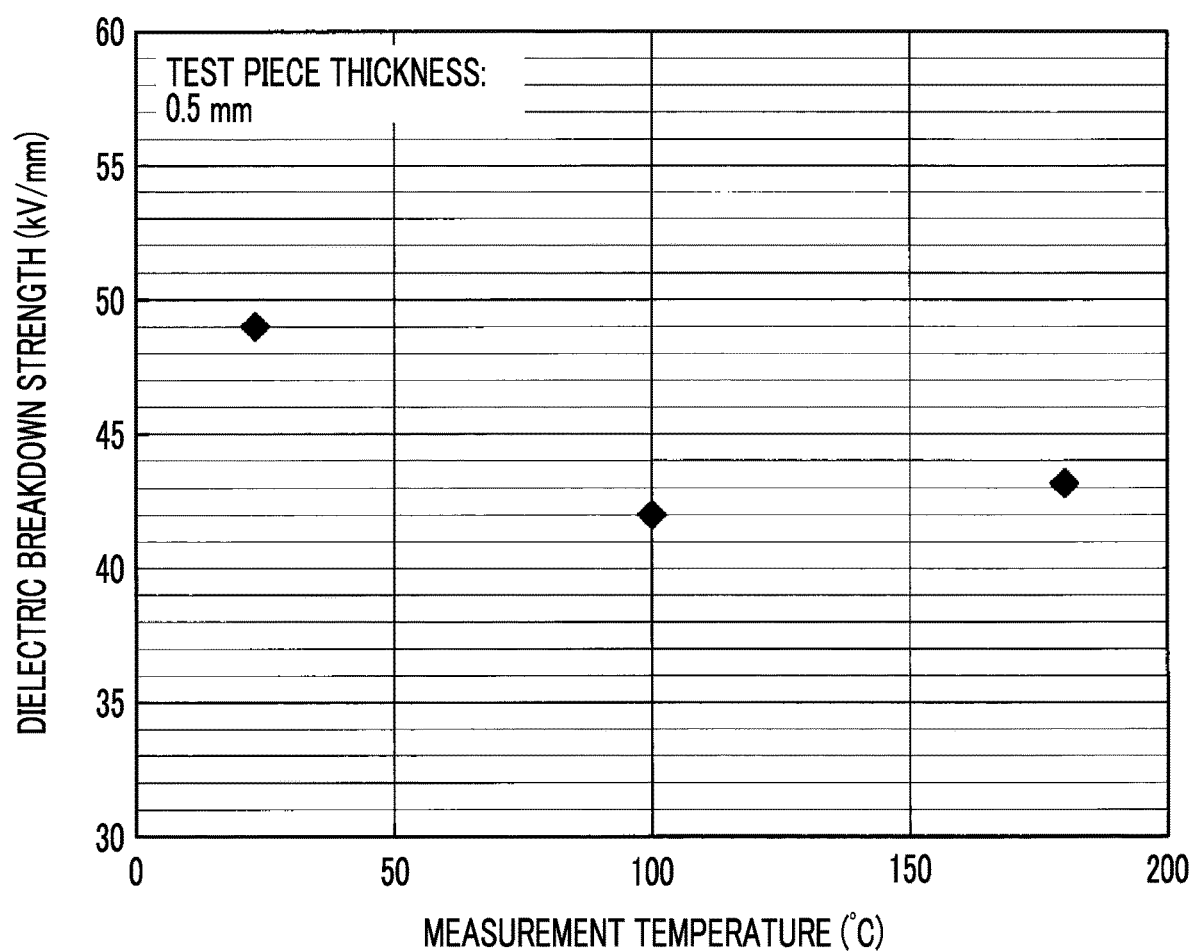
FIG. 8 is a graph showing the results of Example 3.
Figure 9:
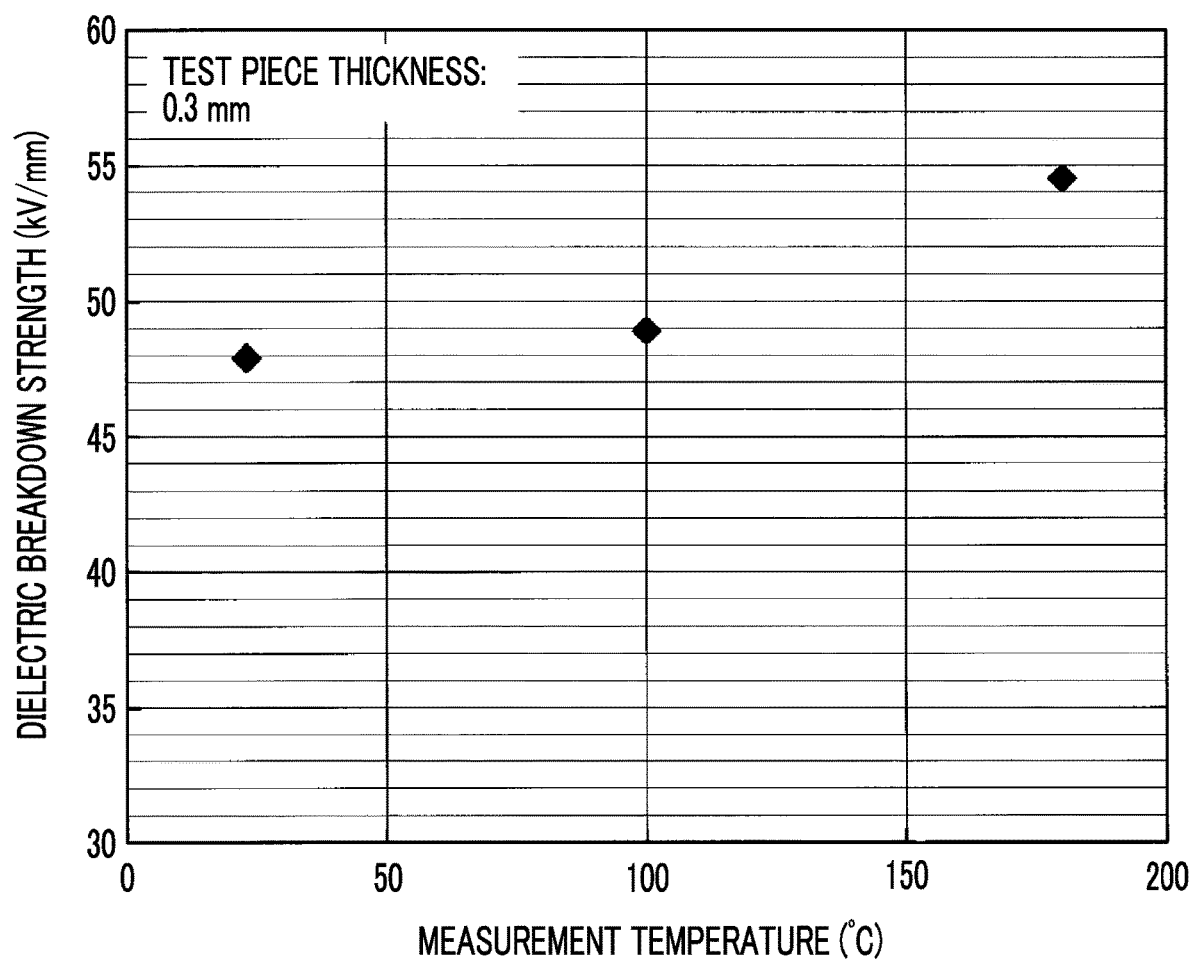
FIG. 9 is a graph showing the results of Example 4.

FIG. 7 is a graph showing the results of Example 2, Comparative Example 1, and Reference Example 1. FIG. 8 is a graph showing the results of Example 3. FIG. 9 is a graph showing the results of Example 4. In FIGS. 7 to 9, the horizontal axis represents a measurement temperature (unit: ° C.) and the vertical axis represents dielectric breakdown strength (unit: kV/mm).

As shown in FIG. 7, in the test piece of Example 2, the dielectric breakdown strength at 24° C. was about 45 kV/mm, whereas the dielectric breakdown strength at 180° C. was about 41 kV/mm, and the dielectric breakdown strength at 180° C. showed a value of at least 0.85 times the dielectric breakdown strength at 24° C.

Further, as shown in FIGS. 8 and 9, also with respect to the test pieces of Examples 3 and 4 in which the sintered compact of Example 2 was used and the thickness was changed, the dielectric breakdown strength at 180° C. showed a value of at least 0.85 times the dielectric breakdown strength at 24° C.

In contrast, as shown in FIG. 7, in the test pieces of Comparative Example 1 and Reference Example 1, the dielectric breakdown strength at 24° C. exceeded 50 kV/mm, whereas the dielectric breakdown strength at 180° C. fell below 40 kV/mm, and the dielectric breakdown strength at 180° C. showed a value less than 0.8 times the dielectric breakdown strength at 24° C.

According to the electrostatic chuck device using the sintered compact of Example 2 as the base, it is difficult for the base to undergo dielectric breakdown even at the time of high-temperature heating, and it becomes possible to treat the wafer with high yield, compared to an electrostatic chuck device using the sintered compact of Comparative Example 1 or Reference Example 1 as the base.

From the above results, it is found that the present invention is very useful.

INDUSTRIAL APPLICABILITY

An electrostatic chuck device in which removal of a wafer is easy even at the time of high-temperature heating is provided.

Further, a method for manufacturing an electrostatic chuck device is provided in which it is possible to easily manufacture an electrostatic chuck device in which removal of a wafer is easy even at the time of high-temperature heating.

An electrostatic chuck device in which the yield of plasma treatment can be improved with high yield is provided.

REFERENCE SIGNS LIST

1: electrostatic chuck device
2: electrostatic chuck part
3: temperature adjusting base part
3A: flow path
3b: through-hole
4: adhesion layer
5: heater element
6: adhesion layer
7: insulating plate
8: adhesive layer
10: focus ring
11: placing plate (base)
11a: placing surface
11b: projection portion
12: supporting plate (base)
13: electrostatic attraction electrode
14: insulating material layer
15: power supply terminal
15a: insulator
16: through-hole
17: power supply terminal
18: insulator
19: groove
20: temperature sensor
21: installation hole
22: temperature measurement part
23: excitation unit
24: fluorescence detector
25: control unit
28: pin insertion hole
29: tubular insulator
100: sintered compact 110: main electrode
120: guard electrode
130: counter electrode
W: plate-shaped sample

The invention claimed is:

1. An electrostatic chuck device comprising:
a base having one principal surface which is a placing surface on which a plate-shaped sample is placed, wherein the base is made from a sintered compact of ceramic particles, which include silicon carbide particles and aluminum oxide particles, as a forming material; and
an electrostatic attraction electrode which is provided on a surface of the base on the side opposite to the placing surface of the base, or in an interior of the base,
wherein a volume resistivity value of the sintered compact is $0.5 \times 10^{15}$ Ωcm or more in an entire range from 24° C. to 300° C.,
a graph which shows a relationship of the volume resistivity value of the sintered compact to a temperature at which the volume resistivity value of the sintered compact is measured has a maximum value in the range from 24° C. to 300° C., and
the amount of metal impurities in the sintered compact other than aluminum and silicon is 100 ppm or less.

2. The electrostatic chuck device according to claim 1, wherein SiC is included in the sintered compact, the SiC is β-SiC, the SiC is dispersed in a state of being surrounded by crystal grains of aluminum oxide, which are a matrix material, and a volume ratio of the β-SiC is 4% by volume or more and 15% by volume or less with respect to the whole of the sintered compact.

3. The electrostatic chuck device according to claim 1, wherein the amount of metal impurities in the sintered compact other than aluminum and silicon is 50 ppm or less.

4. The electrostatic chuck device according to claim 1, wherein dielectric breakdown strength of the sintered compact at 180° C. is at least 0.85 times dielectric breakdown strength of the sintered compact at 24° C.

5. A method of manufacturing the electrostatic chuck device according to claim 1, the method comprising:
a step of preparing a slurry wherein aluminum oxide particles and silicon carbide particles are injected respectively at high speed to mix the aluminum oxide particles and the silicon carbide particles while the aluminum oxide particles and the silicon carbide particles are collided with each other;
a step of removing a dispersion medium from the slurry obtained in the aforementioned step wherein mixing is performed, and subsequently forming a formed body from the slurry;
a step of pressure-sintering the obtained formed body by heating the formed body to a temperature of 1600° C. or higher while compacting the formed body with a pressure of 25 MPa or more under a non-oxidative atmosphere; and
a step of grinding an obtained ceramic sintered compact to form the base.

6. The method of manufacturing an electrostatic chuck device according to claim 5, wherein the aluminum oxide particles have an aluminum oxide content of 99.99% or more.

7. The method of manufacturing an electrostatic chuck device according to claim 5, wherein the non-oxidative atmosphere is at least one of a vacuum atmosphere and an argon atmosphere.

8. The method of manufacturing an electrostatic chuck device according to claim 7,
wherein the non-oxidative atmosphere includes
a vacuum atmosphere that is a first non-oxidative atmosphere, and
an argon atmosphere that is a second non-oxidative atmosphere, and
wherein
in the pressure-sintering step,
the formed body is preliminarily heated at a temperature lower than 1600° C. and normal pressure in the first non-oxidative atmosphere, and then
the formed body is pressure-sintered in the second non-oxidative atmosphere.

9. The method of manufacturing an electrostatic chuck device according to claim 8, further comprising:
an oxidation step wherein oxidation treatment is performed on silicon carbide particles which are included in the formed body, before the preliminary heating is performed.

10. The electrostatic chuck device according to claim 1, wherein the maximum value is located between a region where a volume resistivity value rises along with a temperature rise and a region where a volume resistivity value decreases along with a temperature rise.

11. The electrostatic chuck device according to claim 1, wherein the maximum value is a maximum peak shown in the range from 24° C. to 300° C.

12. An electrostatic chuck device comprising:
a base having one principal surface which is a placing surface on which a plate-shaped sample is placed, wherein the base is made from a sintered compact of ceramic particles, which include silicon carbide particles and aluminum oxide particles, as a forming material; and
an electrostatic attraction electrode which is provided on a surface of the base on the side opposite to the placing surface of the base or in an interior of the base,
wherein dielectric breakdown strength of the sintered compact at 180° C. is at least 0.85 times dielectric breakdown strength of the sintered compact at 24° C., and
the amount of metal impurities in the sintered compact other than aluminum and silicon is 100 ppm or less.

13. The electrostatic chuck device according to claim 12, wherein SiC is included in the sintered compact, the SiC is β-SiC, the SiC is dispersed in a state of being surrounded by crystal grains of aluminum oxide, which are a matrix material, and a volume ratio of β-SiC is 4% by volume or more and 15% by volume or less with respect to the whole of the sintered compact.

14. The electrostatic chuck device according to claim 12, wherein the amount of metal impurities in the sintered compact other than aluminum and silicon is 50 ppm or less.

15. The electrostatic chuck device according to claim 12, wherein a volume resistivity value of the sintered compact is $0.5 \times 10^{15}$ Ωcm or more in an entire range from 24° C. to 300° C., and
a graph which shows a relationship of the volume resistivity value of the sintered compact to a temperature at which the volume resistivity value of the sintered compact is measured has a maximum value in the range from 24° C. to 300° C.

* * * * *